US010483466B2

(12) United States Patent
Schmid et al.

(10) Patent No.: US 10,483,466 B2
(45) Date of Patent: Nov. 19, 2019

(54) P-DOPING CROSS-LINKING OF ORGANIC HOLE TRANSPORTERS

(71) Applicant: Siemens Aktiengesellschaft, Munich (DE)

(72) Inventors: Guenter Schmid, Hemhofen (DE); Anna Maltenberger, Leutenbach (DE); Sebastien Pecqueur, La Couture (FR)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 191 days.

(21) Appl. No.: 15/316,211

(22) PCT Filed: May 28, 2015

(86) PCT No.: PCT/EP2015/061873
§ 371 (c)(1),
(2) Date: Dec. 5, 2016

(87) PCT Pub. No.: WO2015/185440
PCT Pub. Date: Dec. 10, 2015

(65) Prior Publication Data
US 2018/0198069 A1    Jul. 12, 2018

(30) Foreign Application Priority Data
Jun. 3, 2014   (DE) .................. 10 2014 210 412

(51) Int. Cl.
*H01L 51/54* (2006.01)
*H01L 51/00* (2006.01)
*H01L 51/50* (2006.01)
*H01L 51/05* (2006.01)
*H01L 51/42* (2006.01)

(52) U.S. Cl.
CPC ...... *H01L 51/0037* (2013.01); *H01L 51/0036* (2013.01); *H01L 51/0042* (2013.01); *H01L 51/0077* (2013.01); *H01L 51/0079* (2013.01); *H01L 51/5056* (2013.01); *H01L 51/0558* (2013.01); *H01L 51/42* (2013.01); *Y02E 10/549* (2013.01)

(58) Field of Classification Search
CPC ............ H01L 51/0032; H01L 51/0035; H01L 51/0037; H01L 51/0042; H01L 51/0036; H01L 51/0079; H01L 51/0558; H01L 51/52; H01L 51/5056; Y02E 10/549

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | |
|---|---|---|---|
| 5,247,226 A * | 9/1993 | Sato ...................... | C09K 11/06 313/504 |
| 9,929,362 B2 | 3/2018 | Maltenberger et al. | |
| 2006/0093852 A1 | 5/2006 | Marsitzky et al. ........... | 428/690 |
| 2009/0167158 A1 | 7/2009 | Kathirgamanathan et al. ............. 313/504 |
| 2014/0034934 A1 | 2/2014 | Kellermann et al. ........... | 257/40 |
| 2014/0142259 A1 | 5/2014 | Volz et al. .................... | 525/539 |
| 2015/0123047 A1* | 5/2015 | Maltenberger ...... | H01L 51/0077 252/519.21 |

FOREIGN PATENT DOCUMENTS

| | | | | |
|---|---|---|---|---|
| CN | 103339753 A | | 10/2013 | ............. H01L 51/00 |
| DE | 10224617 A1 | | 12/2003 | ............. C08G 61/02 |
| DE | 10311767 A1 | | 9/2004 | ............. C06G 61/02 |
| DE | 102012209523 A1 | | 12/2013 | ................. C07F 9/00 |
| WO | 2007/052083 A2 | | 5/2007 | ............. H01L 51/00 |
| WO | 2013/182383 A1 | | 12/2013 | ............. H01L 51/00 |
| WO | WO-2013182389 A2 * | | 12/2013 | ......... H01L 51/0077 |
| WO | 2015/185440 A1 | | 12/2015 | ............. H01L 51/30 |

OTHER PUBLICATIONS

Chinese Office Action, Application No. 201580029805.1, 10 pages, dated Jul. 2, 2018.
International Search Report and Written Opinion, Application No. PCT/EP2015/061873, 19 pages, dated Jul. 22, 2015.
Japanese Office Action, Application No. 2016571001, 4 pages, dated Jan. 9, 2018.

* cited by examiner

*Primary Examiner* — Andrew K Bohaty
(74) *Attorney, Agent, or Firm* — Slayden Grubert Beard PLLC

(57) ABSTRACT

A method for producing hole-transporting electrical layers includes reacting a functionalized organic matrix compound with at least one cross-linking reagent on a substrate, which thereby forms higher-molecular-weight compounds. The functionalized organic matrix compound may include particular constituents arranged in a particular chemical formula.

27 Claims, 1 Drawing Sheet

P-DOPING CROSS-LINKING OF ORGANIC HOLE TRANSPORTERS

CROSS-REFERENCE TO RELATED APPLICATIONS

This application is a U.S. National Stage Application of International Application No. PCT/EP2015/061873 filed May 28, 2015, which designates the United States of America, and claims priority to DE Application No. 10 2014 210 412.2 filed Jun. 3, 2014, the contents of which are hereby incorporated by reference in their entirety.

TECHNICAL FIELD

The present invention relates to a method for producing hole-transporting electrical layers, in which a functionalized organic matrix compound is reacted with at least one cross-linking reagent on a substrate to form compounds of relatively high molecular mass, where the functionalized organic matrix compound conforms to formula 1 below

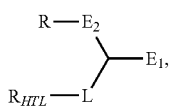

formula 1 where

L is a bond or is selected from the group consisting of substituted or nonsubstituted, saturated or unsaturated C1-C50 alkyl, aryl, polyethylene glycol, polyethylenediamine, polyester, polyurethane, polyvinylidenephenyl chains or mixtures thereof;

$E_1$, $E_2$ independently of one another may be oxygen, sulfur, selenium, NH or $NE_3$, where $E_3$ is selected from the group consisting of substituted or nonsubstituted alkyl or aryl, and $E_3$ may be joined to R;

R is selected from the group consisting of H, D, C1-C10 alkyl-silyl or aryl-silyl esters, fluorinated or nonfluorinated branched or unbranched C1-C10 alkyl, aryl or heteroaryl, $R_{HTL}$ is the base structure of an organic hole transporter, and the crosslinking reagent comprises at least one metal atom from groups 13-15 and at least one organic ligand.

BACKGROUND

The components in organic electronics that are commercially the most important are nowadays obtained substantially by means of two different production methods. Employed on the one hand are wet operations in which organic layers are constructed by deposition from a solution using various printing technologies, such as, for example, inkjet, gravure or offset printing, spin coating or slot coating. Alternatively, deposition of the layers may take place from the gas phase by means of sublimation, i.e., thermal evaporation under reduced pressure. Sublimation is used to produce the hitherto most efficient commercially available organic components, such as, for example, organic light-emitting diodes (see FIG. 1), solar cells (see FIG. 2), transistors (see FIG. 3), and bipolar transistors. One of the ways in which these components achieve their efficiency is by virtue of their construction from a great number of individual layers, with each of the layers having a specific electrical function based also on the location within the component.

Organic components which are produced by solvent operations currently still possess a much lower complexity in their construction. This is a consequence of the process in light of the requirement that an organic layer deposited may not be incipiently dissolved by the subsequent organic solvents in further processing steps. In order to meet this boundary condition, it is therefore necessary in the ongoing operation to employ solvents which are orthogonal (i.e., are not miscible with the preceding solvent). The reason for this is so that underlying layers are not incipiently dissolved again. This procedure limits the number of solvents which can be used and the number of organic substances which can be processed, and so restricts the possibilities and quality of layer sequences which can be processed in wet operation.

While the boundary condition indicated above applies to the production of any electrically functional, i.e., blocking, n- or p-conducting, organic layer in organic components, the production in particular of high-efficiency and long-lived p-conducting layers is challenging. This is so in view of the operating conditions to be observed and the selection of suitable compounds, which are required to combine such high functionality with long service lives of the components constructed from them.

A route to the production of efficient organoelectronic components with p-doped hole transporters is shown for example by DE102012209523. This patent specification discloses organic components which comprise a matrix, the matrix comprising as p-dopant a main-group metal complex from groups 13 to 15. This complex in turn comprises at least one ligand L of the following structure:

where $R^1$ and $R^2$ independently of one another may be oxygen, sulfur, selenium, NH or $NR^4$, $R^4$ being selected from the group containing alkyl or aryl and possibly being joined to $R^3$; and $R^3$ is selected from the group containing alkyl, long-chain alkyl, alkoxy, long-chain alkoxy, cycloalkyl, haloalkyl, aryl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, where, in the case of suitable radicals, one or more nonadjacent $CH_2$ groups independently of one another may be replaced by —O—, —S—, —NH—, —NR°—, —SiR°R°°—, —CO—, —COO—, —OCO—, —OCO—O—, —$SO_2$—, —S—CO—, —CO—S—, —$CY_1$=$CY_2$ or —C≡C—, specifically such that O and/or S atoms are not joined directly to one another, likewise optionally replaced by aryl or heteroaryl preferably containing 1 to 30 C atoms.

Nevertheless there continues to be demand for systems in organic electronics which can be processed simply, reproducibly, and stably both from the wet phase and from the gas phase, producing layers which are able to exhibit an enhanced lifetime under the thermal loads in the operation of components resulting therefrom.

SUMMARY

One embodiment provides a method for producing hole-transporting electrical layers, wherein a functionalized organic matrix compound is reacted with at least one crosslinking reagent on a substrate to form compounds of relatively high molecular mass, where the functionalized organic matrix compound conforms to formula 1 below

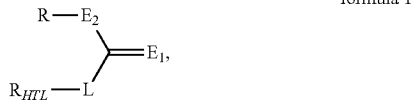

formula 1 where

L is a bond or is selected from the group consisting of substituted or nonsubstituted, saturated or unsaturated C1-C50 alkyl, aryl, polyethylene glycol, polyethylenediamine, polyester, polyurethane, polyvinylidenephenyl chains or mixtures thereof;

$E_1$, $E_2$ independently of one another may be oxygen, sulfur, selenium, NH or $NE_3$, where $E_3$ is selected from the group consisting of substituted or nonsubstituted alkyl or aryl, and $E_3$ may be joined to R;

R is selected from the group consisting of H, D, C1-C10 alkyl-silyl or aryl-silyl esters, fluorinated or nonfluorinated branched or unbranched C1-C10 alkyl, aryl or heteroaryl, $R_{HTL}$ is the base structure of an organic hole transporter, and the crosslinking reagent comprises at least one metal atom from groups 13-15 and at least one organic ligand.

In one embodiment, $E_1$ and $E_2$ from formula 1 are oxygen.

In one embodiment, the crosslinking reagent comprises metal atoms from the group consisting of bismuth, tin, lead or mixtures thereof.

In one embodiment, the crosslinking reagent comprises bismuth or tin and at least one ligand of the crosslinking reagent is selected from the group consisting of substituted or nonsubstituted C1-C200 aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, and, in the case of appropriate radicals, one or more nonadjacent $CH_2$ groups independently of one another may be replaced by —O—, —S—, —NH—, —NR°—, —SiR°R°°—, —CO—, —COO—, —OCO—, —OCO—O—, —SO$_2$—, —S—CO—, —CO—S—, —C=C— or —C≡C—, specifically such that O and/or S atoms are not joined directly to one another.

In one embodiment, the base structure of the organic hole transporter is selected from the group consisting of PEDOT (poly(3,4-ethylenedioxythiophene)), PVK (poly(9-vinylcarbazole)), PTPD (poly(N,N'-bis(4-butylphenyl)-N,N'-bis(phenyl)benzidine)), PANI (polyaniline), P3HT (poly(3-hexylthiophene)) or mixtures thereof.

In one embodiment, the crosslinking reagent comprises at least one substituent according to formula 2 below

formula 2 where n=0-20.

In one embodiment, the crosslinking reagent comprises bismuth or tin and comprises at least one substituent with the structure below:

formula 3

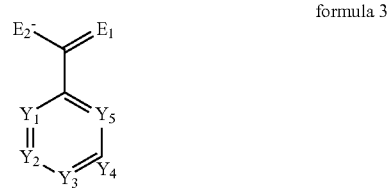

formula 4

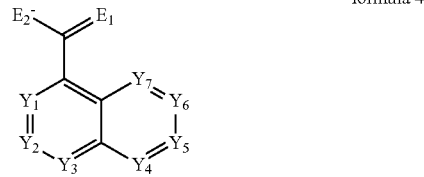

formula 5 where $Y_m$ with m from 1-7 independently of one another may be selected from the group consisting of C—H, C-D, C—F, C—CF$_3$, C—NO$_2$, C—CN, C—Cl, C—Br, C—CN$_3$, C—OCN, C—NCO, C—CNO, C—SCN, C—NCS, C—SeCN.

In one embodiment, the crosslinking reagent comprises at least one substituent selected from the group of 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy)benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(trifluoromethyl)benzoate; 2,4-difluorobenzoate; 2,5-difluorobenzoate; 2,6-bis(trifluoromethyl)benzoate; 2,6-difluorobenzoate; 2-chloro-6-fluorobenzoate; 2-fluoro-4-(trifluoromethyl)benzoate; 2-fluoro-5-(trifluoromethyl)benzoate; 2-fluoro-6-(trifluoromethyl)-benzoate; 3,4,5-trifluorobenzoate; 3,4-difluorobenzoate; 3,5-bis(trifluoromethyl)benzoate; 3-(trifluoromethyl)benzoate; 3-chloro-4-fluorobenzoate; 3-fluoro-5-(trifluoromethyl)benzoate; 3-fluorobenzoate; 4-fluoro-2-(trifluoromethyl)benzoate; 4-fluoro-3-(trifluoromethyl)benzoate; 5-fluoro-2-methylbenzoate; 2-(trifluoromethoxy)benzoate; 2,3,5-trichlorobenzoate; 4-(trifluoromethyl)benzoate; pentafluorobenzoate; 2,3,4,5-tetrafluorobenzoate; 2,3,5,6-tetrafluoro-4-(trifluoromethyl)benzoate; 2-fluorophenyl acetate; 3-fluorophenyl acetate; 4-fluorophenyl acetate; 2,3-difluorophenyl acetate; 2,4-difluorophenyl acetate; 2,6-difluorophenyl acetate; 3,4-difluoro-phenyl acetate; 3,5-difluorophenyl acetate; pentafluorophenyl acetate; 2-chloro-6-fluorophenyl acetate; 2-chloro-3,6-difluorophenyl acetate; 3-chloro-2,6-difluorophenyl acetate; 3-chloro-4-fluorophenyl acetate; 5-chloro-2-fluorophenyl acetate; 2,3,4-trifluorophenyl acetate; 2,3,5-trifluorophenyl acetate; 2,3,6-trifluorophenyl acetate; 2,4,5-trifluorophenyl acetate; 2,4,6- trifluorophenyl acetate; 3,4,5-trifluorophenyl acetate; 3-chloro-2-fluorophenyl acetate; α-fluorophenyl acetate; 4-chloro-2-fluorophenyl acetate; 2-chloro-4-fluorophenyl acetate; α,α-difluorophenyl acetate; ethyl 2,2-difluoro-2-phenyl acetate; methyl trifluoroacetate; allyl trifluoroacetate; ethyl trifluoroacetate; isopropyl trifluoroacetate; 2,2,2-trifluoroethyl trifluoroacetate; difluoroacetate; tri-fluoroacetate; methyl chlorodifluoroacetate; ethyl bromo-difluoroacetate; chlorodifluoroacetate; ethyl chloro-fluoroacetate; ethyl difluoroacetate; (3-chlorophenyl)-difluoroacetate; (3,5-difluorophenyl)difluoroacetate; (4-butylphenyl) difluoroacetate; (4-tert-butylphenyl)difluoroacetate; (3,4-dimethylphenyl)difluoroacetate; (3-chloro-4-fluorophenyl)difluoroacetate; (4-chlorophenyl)difluoroacetate; 2-biphenylyl-3',5'-difluoroacetate; 3-biphenylyl-3',5'-difluoroacetate; 4-biphenylyl-3',5'-difluoroacetate; 2-biphenylyl-3',4'-difluoroacetate; 3-biphenylyl-3',4'-difluoroacetate; 4-biphenylyl-3',4'-difluoroacetate, and 2,2-difluoropropionate.

In one embodiment, the crosslinking reagent comprises bismuth or tin and at least one of its substituents is selected from the group consisting of 2,6-difluorobenzoate, 4-fluorobenzoate, 3-fluorobenzoate, 3,5-difluorobenzoate, 3,4,5-trifluorobenzoate, 3,5-bis(trifluoromethyl)benzoate, perfluorobenzoate, 4-perfluorotoluate or mixtures thereof.

In one embodiment, the base structure $R_{HTL}$ of the organic hole transporter is selected from the group consisting of C20-C200 triarylamine-based hole transporters, thiophene-containing derivatives thereof or mixtures thereof.

In one embodiment, the crosslinking reagent is a substituted or nonsubstituted triaryl-bismuth complex.

In one embodiment, the crosslinking reagent and the organic matrix compound are reacted on the substrate by means of a temperature treatment in a range of greater than or equal to 50° C. and less than or equal to 300° C.

In one embodiment, the functionalized organic matrix compound comprises a further fraction of greater than or equal to 0 weight % and less than or equal to 50 weight % of nonfunctionalized matrix compound.

Another embodiment provides an organoelectric component comprising at least one hole-transporting electrical layer, produced by a method as disclosed above.

Another embodiment provides a use of such component as an organic solar cell, organic transistor, light-emitting organic component, organic light-emitting diode and/or organic light-emitting electrochemical cell.

BRIEF DESCRIPTION OF THE DRAWINGS

Example aspects and embodiments of the invention, including example layer construction of components for organic electronics, are described in more detail below with reference to figures, in which.

DETAILED DESCRIPTION

Figure 1:
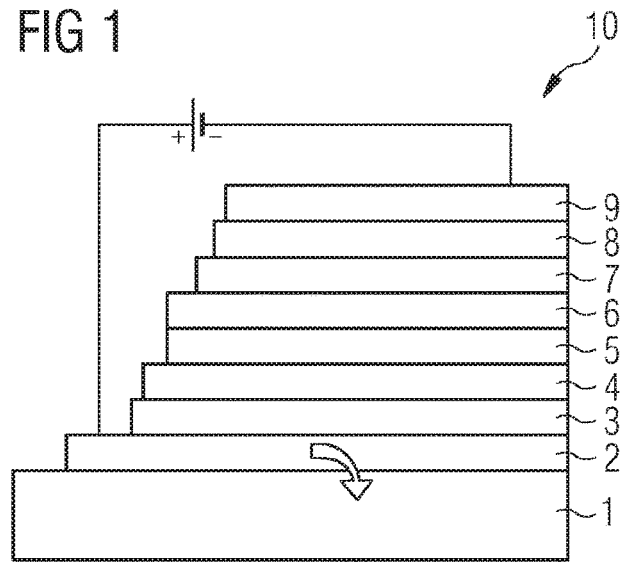
FIG. 1 shows schematically the construction of an organic light-emitting diode, according to an example embodiment.

Embodiments of the present invention provide an improved method for producing hole-transporting layers that is suitable particularly for wet production, with the resulting layers exhibiting an enhanced stability. The fundamental principle of the method might also find use, furthermore, for the production of n-conducting layers and electron-blocking layers in organic components.

Some embodiments provide a method for producing hole-transporting electrical layers, wherein a functionalized organic matrix compound is reacted with at least one crosslinking reagent on a substrate to form compounds of relatively high molecular mass, where the functionalized organic matrix compound conforms to formula 1 below

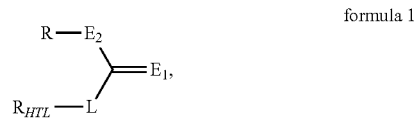

formula 1 where

L is a bond or is selected from the group consisting of substituted or nonsubstituted, saturated or unsaturated C1-C50 alkyl, aryl, polyethylene glycol, polyethylenediamine, polyester, polyurethane, polyvinylidene-phenyl chains or mixtures thereof;

$E_1$, $E_2$ independently of one another may be oxygen, sulfur, selenium, NH or $NE_3$, where $E_3$ is selected from the group consisting of substituted or nonsubstituted alkyl or aryl, and $E_3$ may be joined to R;

R is selected from the group consisting of H, D, C1-C10 alkyl-silyl or aryl-silyl esters, fluorinated or nonfluorinated branched or unbranched C1-C10 alkyl, aryl or heteroaryl, $R_{HTL}$ is the base structure of an organic hole transporter, and the crosslinking reagent comprises at least one metal atom from groups 13-15 and at least one organic ligand. It has been found that through the reaction of a crosslinking reagent of the invention, comprising at least one metal atom from groups 13-15, with an inventively functionalized base structure of an organic hole transporter, doped hole-transporting layers can be obtained which are producible more simply and more reproducibly and which, moreover, exhibit a significantly improved service life.

In principle here, the reacting of the functionalized organic matrix compound with the crosslinking reagent may take place in one stage or else a multiplicity of stages. Thus, for example, in a 1st step the crosslinking reagent may be reacted, or may react, with a 1st functionalized organic matrix compound:

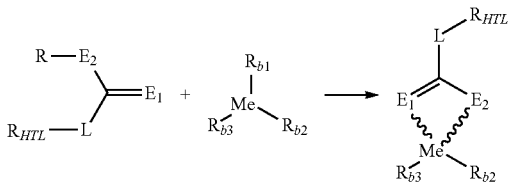

$R-R_{b1}$

In a 2nd reaction step, then, a further functionalized organic matrix compound may be coupled to the crosslinker:

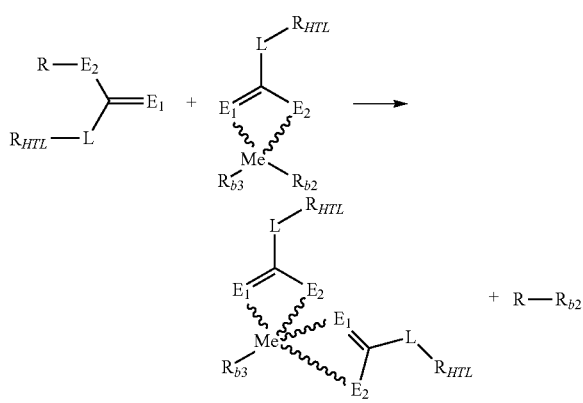

Also possible in principle is a complete crosslinking, by the coupling of a 3rd functionalized matrix compound:

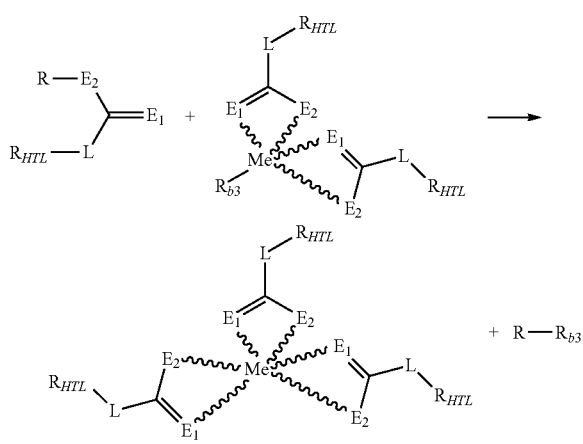

The reacting in the sense of the invention is achieved by one of the intermediate steps represented above. This means that there are not necessarily always 3 functionalized organic matrix compounds which must be coupled to one crosslinker. Reaction with only one organic matrix compound also leads already to the hole transporters of the invention. Through the reaction with the functionalized organic matrix compound, in purely formal terms, an electron may be given up by the organic matrix compound to the crosslinker, which functions as a Lewis acid. The giving up of an electron alters, formally, the oxidation number of the metal atom. Through this process, positive charges can be generated in the organic matrix compound, and can be subsequently delocalized over the base structure of the matrix compound and other molecules in the layer. In this way, the hole transport capacity is maintained or increased by an increase in the number of charge carriers available in the layer.

Without being tied by the theory, the improved service life of the layers may result from the crosslinking reaction producing a stronger (linked) layer microstructure which has less of a tendency toward crystallization and so exhibits an increased stability toward solvents and thermal loading and hence also enhanced service life in conjunction with greater conductivity on the part of the layer. It is not until the reaction of the crosslinker with the functionalized organic matrix here that a strong connection to the organic matrix is generated, one which is capable of significantly improving the hole transport properties of the matrix. This can be achieved by at least one ligand of the crosslinking reagent being eliminated as part of the chemical crosslinking reaction, with this coordination site being replaced by the functionalized group of the organic matrix compound. This new ligand is then linked covalently, in accordance with the invention, with the base structure of the organic hole transporter. This contrasts with normal processes, whereby no covalent linking of a ligand of the dopant with the organic hole transporter is obtainable. Here, in particular, the formation of relatively high molecular mass complexes after reaction of the crosslinker may counteract a tendency on the part of the layer toward crystallization. Moreover, the strong attachment of the group 13-15 metal atoms to the functionalized organic matrix compound allows a further processing latitude within wet operations. The strong attachment obviates the boundary condition whereby orthogonal solvents must be used when applying further layers. The firm anchoring of the metal atoms to the matrix molecules prevents their being washed out, even if the metal atoms would in principle have been soluble in the subsequent solvents. As a result, there is a broader range of solvents which can be used within wet operation. Potentially, therefore, it is possible to tailor the solvent directly to the substances to be dissolved, and the risk of the dopant being washed out of the already processed matrix can be disregarded. This results in much greater flexibility in operation. Furthermore, as a result of this operational regime, it is possible to incorporate a significantly greater number of different metal complexes into the matrix, since the crosslinking complex composed of the group 13-15 metal and the organic ligand need not from the outset be a conventional p-dopant for a hole transporter. It is conceivable, in particular, for this crosslinker to exhibit no increase in hole transportability with the usual organic matrix molecules. It may in particular be in accordance with the invention for the crosslinker to contribute to an increase in the hole transportability of the layer only through/after reaction with the functionalized matrix compound, with the new, doping complex not being formed at all until elimination of a ligand and coupling of the base structure of the organic matrix via the functionalization. Also conceivable, however, is for the crosslinker itself to be able to bring about a (slight) intrinsic increase in the hole transportability of organic matrix compounds. The reaction with the functionalized matrix, however, does bring about a much greater hole transportability on the part of the resulting compound, and hence also on the part of the layer, in comparison to the unreacted crosslinker. Without being tied by the theory, complexes with at least one group 13-15 metal atom in particular are suitable for reaction with the matrix compound functionalized in accordance with the invention. This is very probably because these metals, with the functionalization according to the invention, exhibit particularly rapid and complete reaction on account of their size and electrical properties. This is able in particular to lead to especially effective production and high-functionality layers.

As a result of the attachment of the dopant to the organic matrix, moreover, it is also possible to conceive of modes of production in which elements of a wet operation are joined with those of a reduced-pressure operation. For example, a 1st layer of crosslinker and functionalized organic matrix compound could be deposited via a gas-phase operation, and a further 2nd layer could be applied by a solvent operation in a subsequent operating step. The reaction of the crosslinker with the organic matrix compound would prevent doping of the 1st layer being destroyed again by the application of the solvent.

The above-indicated principle of in situ doping may be illustrated with reference to a specific example as follows:

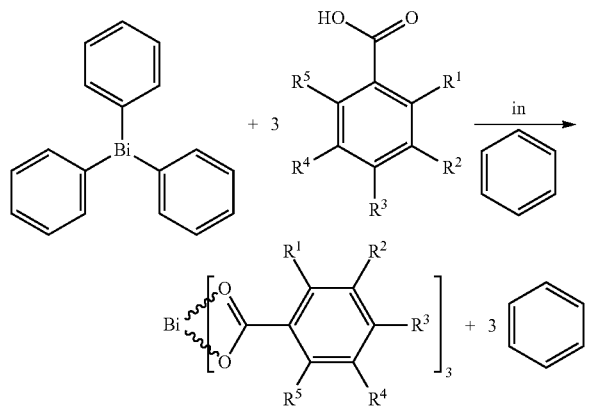

At least one of the substituents $R^1$-$R^5$ here is the base structure of the organic hole transporter, which is attached by a covalent linkage to the functionalizing group. The reaction need also not necessarily result in the complete reaction of all ligands in the crosslinking reagent, in other words 3-fold, but may instead also be steered in such a way that only 1 or 2 ligands are replaced.

The above example uses a crosslinker and 3 functionalized organic matrix compounds, which in this example have been functionalized by a carboxylic acid group ($E_1$=$E_2$=O, R=H). The functionalized organic matrix compound is able to react with the crosslinker, with displacement of a ligand of the crosslinker. This results in a compound which has a higher molecular weight. Through the reaction with the functionalized organic matrix compound, moreover, a compound is obtained which has hole transport properties. Especially noteworthy is the fact that the crosslinker as such need not have any p-doping properties. The capacity for increasing the p-conductivity comes about essentially only after the reaction with the functionalized organic matrix compound. In this case the ligands of the original crosslinker compound correspond to the solvent.

The crosslinker is reacted with the functionalized organic matrix compound on a substrate, with formation of relatively high molecular mass compounds. It is possible here to use the substrates which are customary in the field of organic electronics. These may be, for example, inert substrates such as layers of glass, of silicone or of plastic. Also contemplated, of course, are functional layers applied beforehand by wet operations or sublimation techniques. The crosslinker and the functionalized organic matrix compound are reacted here in such a way that the functionalized organic matrix compound becomes at least part of the coordination sphere of the crosslinker, and especially of the metal atom of the crosslinker. In principle, therefore, there is a ligand exchange on the metal atom. Through the accommodation of the organic matrix compound into the coordination sphere of the metal atom of the crosslinker, an increase is achieved in the molecular weight of the crosslinker complex. This is like a condensation reaction in which, as shown in the above example, phenyl ligands are eliminated in the form of benzene. The reaction of the crosslinker with the functionalized organic matrix compound may be quantified via NMR spectroscopy methods, for example. Thus, for example, generally $^1$H-NMR and, in the case for example of bismuth as a possible constituent of the crosslinker, the determination of the quantitative conversion via a bismuth NMR, are appropriate. The reaction may also be monitored quantitatively via electrical or IR spectroscopy methods.

The organic matrix compound therefore comprises or consists of a base structure of an organic hole transporter ($R_{HTL}$) and at least one functionalizing group.

In one embodiment of the method, the base structure $R_{HTL}$ of the organic hole transporter may be selected from the group consisting of C20-C200 triarylamine-based hole transporters, thiophene-containing derivatives thereof or mixtures thereof. In principle it is possible to use all hole transporters known to the skilled person for the functionalization. More particularly, however, it is possible to use the C20-C200 triarylamine-based hole transporters or thiophene-containing derivatives. In one preferred embodiment of the invention, the base structure of the organic hole transporter may be selected from C20-C500 triarylamine-based hole transporters. An example compound for a thiophene-containing derivative of a triarylamine-based hole transporter is, for example, N4,N4'-bis(dibenzo[b,d]thiophen-4-yl)-N4,N4'-diphenylbiphenyl-4,4'-diamine (DBTPB, Cas. No. 1203895-80-0) or oligomers or polymers thereof.

Units contemplated in the base structure of the functionalized matrix $R_{HTL}$ of an organic hole transporter include, for example, the following compounds, or mixtures of these compounds: NPB (N,N'-bis(naphthalen-1-yl)-N,N'-bis(phenyl)benzidine), β-NPB (N,N'-bis(naphthalen-2-yl)-N,N'-bis(phenyl)benzidine) TPD (N,N'-bis(3-methylphenyl)-N,N'-bis(phenyl)benzidine) Spiro TPD (N,N'-bis(3-methylphenyl)-N,N'-bis(phenyl)benzidine) Spiro-NPB (N,N'-bis(naphthalen-1-yl)-N,N'-bis(phenyl)-spiro) DMFL-TPD N,N'-bis(3-methylphenyl)-N,N'-bis(phenyl)-9,9-dimethylfluorene) DMFL-NPB (N,N'-bis(naphthalen-1-yl)-N,N'-bis(phenyl)-9,9-dimethylfluorene) DPFL-TPD (N,N'-bis(3-methylphenyl)-N,N'-bis(phenyl)-9,9-diphenylfluorene) DPFL-NPB (N,N'-bis(naphthalen-1-yl)-N,N'-bis(phenyl)-9,9-diphenylfluorene) Spiro-TAD (2,2',7,7'-tetrakis(N,N-diphenylamino)-9,9'-spirobifluorene) 9,9-bis[4-(N,N-bisbiphenyl-4-ylamino)phenyl]-9H-fluorene 9,9-bis[4-(N,N-bisnaphthalen-2-ylamino)phenyl]-9H-fluorene 9,9-bis[4-(N,N'-bisnaphthalen-2-yl-N,N'-bisphenylamino)phenyl]-9H-fluorene N,N'-bis(phenanthren-9-yl)-N,N'-bis(phenyl)benzidine 2,7-bis[N,N-bis(9,9-spirobifluoren-2-yl)amino]-9,9-spirobifluorene 2,2'-bis[N,N-bis(biphenyl-4-yl)amino]-9,9-spirobifluorene 2,2'-bis(N,N-diphenylamino)-9,9-spirobifluorene di[4-(N,N-ditolylamino)phenyl]cyclohexane 2,2',7,7'-tetra(N,N-ditolyl)aminospirobifluorene N,N,N',N'-tetranaphthalen-2-ylbenzidine. These compounds may also be used in oligomeric or polymeric form. Preferably the oligomers or polymers here may have a molecular weight of greater than or equal to 300 Da and less than or equal to 500 000 Da, additionally of greater than or equal to 1000 Da and less than or equal to 250 000 Da. Accordingly, for example, above-stated hole transporter base structures $R_{HTL}$ within this molecular weight range have been found to be particularly suitable and available for the crosslinking according to the invention. The molecular weight of the organic hole transporter may be obtained according to the common methods for molecular weight determination. Cited at this point is the weight-average molecular weight, which can be determined, for example, via GPC, viscometry or by other rheological techniques. Furthermore, light scattering is also suitable for the determination of the molecular weight.

These base structures of the organic matrix compound may exhibit the functionalizing group at any substitutable locus of their base structure. In principle it is also possible for these base structures to have more than one functionalizing group. In particular it may be advantageous for the organic matrix compound to have 0.01-10, preferably 0.05-5, more preferably 0.1-1 crosslinkable functional group(s) per base structure. Especially preferred is for the functionalized organic matrix compound to carry one functional group.

The crosslinking reagent comprises or consists of a metal atom from groups 13-15 and at least one organic ligand which can be eliminated by the functionalized group of the invention. With 2 or more eliminable ligands, crosslinking with a plurality of functionalized base structures can take place, although even a single attachment of a crosslinker to only one functionalized base structure is in accordance with the invention.

The term "metal atom from groups 13-15" is understood to mean the metals of groups 13 to 15 according to IUPAC, i.e., aluminum, gallium, indium, silicon, germanium, tin, lead, thallium, arsenic, antimony, bismuth or mixtures thereof. Preferred metals are those from groups 14 and 15, i.e., silicon, germanium, tin, lead, arsenic, antimony, bismuth.

The crosslinker comprises at least one organic ligand. Ligands in the sense of the invention here are organic molecules of low molecular mass which may be uncharged or charged, having a molecular weight of up to 250 daltons. The low molecular mass organic molecules here may be aliphatic or aromatic, may have heteroatoms such as oxygen and sulfur, for example, and may be cyclic or straight-chain.

For the purposes of the present invention, the designation "p-dopant" embraces or signifies, in particular, materials which have a Lewis acidity and/or are capable of forming, with the matrix material, complexes in which these materials (even if only formally) act as Lewis acids.

Additionally suitable by way of example as linker group L of the functionalized organic matrix compound are the following:
  a. aliphatic chains such as —(CH$_2$)$_n$—R in which n=1-20, preferably n=1-5;
  b. fluorinated alkyl chains having 1-12 carbon atoms in the chain, more preferably 6-10 carbon atoms;
  c. unsaturated alkyl chains having 1-20 carbon atoms and conjugated and/or nonconjugated double bonds;
  d. unsaturated alkyl chains having 1-20 carbon atoms and conjugated and/or nonconjugated triple bonds, including in conjunction with aromatics;
  e. in place of an alkyl chain, it is also possible to use a polyethylene glycol, polyethylenediamine, polyester, polyurethane, polyvinylidenephenylene chain;
  f. chains which contain aromatics or polyenes for a conducting coupling;
  g. mixed variants from a-g.

In one embodiment of the method, E$_1$ and E$_2$ from formula 1 may be oxygen. Carboxylic acids or the carboxylates have proven particularly suitable in the context of the method of the invention for reaction with the crosslinker which can be used in accordance with the invention. The carboxylic acids or carboxylates in particular, as functional groups of the organic matrix compound, can result, by reaction with the crosslinker, in particularly temperature-stable and solvent-stable layers. Without being tied by the theory, a metal-carboxylate complex is formed here which has Lewis acid activity and is able to interact especially well with the base structure of the organic matrix compound. As a result, particular stable p-conducting layers can be obtained in which the metal atom is bonded coordinately, and hence particularly strongly, to the organic matrix compound, and so no dopant can be dissolved from the preceding layers in further wet operations for example. Furthermore, the carboxylates and carboxylic acids appear to be especially suitable functional groups for allowing rapid and complete reaction with the crosslinker.

In a further embodiment of the method, the crosslinking reagent may encompass metal atoms from the group consisting of bismuth, tin, lead or mixtures thereof. It has emerged that, in particular, bismuth, tin and lead or mixtures thereof are capable of reacting rapidly and completely with the functionalized organic matrix compound and so forming compounds of relatively high molecular mass. Accordingly, these metal atoms are then difficult to dissolve out of the organic matrix compound again, even by further solvents. This may result in more effective capacity for the layers of the invention to be produced by wet operations, for example. By virtue of their electron configuration and Lewis acidity, moreover, these metal atoms can induce particularly good hole transport on the part of the resulting layers in complexes of relatively high molecular mass.

In an alternative embodiment, the crosslinking reagent may comprise bismuth or tin and at least one ligand of the crosslinking reagent may be selected from the group consisting of substituted or nonsubstituted C1-C200 aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, and, in the case of appropriate radicals, one or more nonadjacent CH$_2$ groups independently of one another may be replaced by —O—, —S—, —NH—, —NR$^o$—, —SiR$^o$R$^{oo}$—, —CO—, —COO—, —OCO—, —OCO—O—, —SO$_2$—, —S—CO—, —CO—S—, —C=C— or —C≡C—, specifically such that O and/or S atoms are not joined directly to one another. Tin and bismuth in particular have proven particularly suitable for producing p-conducting layers, on account of their availability, environmental friendliness, and their electronic properties. Furthermore, complexes of these methods with the listed substituents, in particular, are able to lead to crosslinkers which react particularly quickly and completely with the organic matrix molecules functionalized in accordance with the invention. As a result, particularly stable p-conducting layers can be obtained. Without being tied by the theory, the rapid and complete reaction with the functionalized matrix compounds is a result of the specific steric and electronic configuration of the substituents. These substituents, moreover, can also result in a suitable Lewis acidity on the part of the crosslinker, which is also able to contribute to rapid and complete reaction of the crosslinker with the functionalized organic matrix compound. The aforementioned ligands may in particular be ligands which can be eliminated from the crosslinking reagent through the reaction with the functionalized organic matrix.

In an additional embodiment, the base structure of the organic hole transporter may be selected from the group consisting of or consisting of PEDOT (poly(3,4-ethylenedioxythiophene)), PVK (poly(9-vinylcarbazole)), PTPD (poly(N,N'-bis(4-butylphenyl)-N,N'-bis(phenyl)benzidine)),
PANI (polyaniline), P3HT (poly(3-hexylthiophene)) or mixtures thereof. It has emerged that this particular group of organic hole transporters can be processed particularly effectively within this method of the invention. This is so especially for the crosslinking of these functionalized base structures within wet operations. These p-conducting layers produced in a wet operation may have particularly high p-conductivity, and layers produced therefrom may exhibit a particularly high service life by way of the crosslinking according to the invention.

In a further embodiment, the units in the base structure of the functionalized matrix $R_{HTL}$ of an organic hole transporter may be selected from the following compounds or mixtures of these compounds: NPB (N,N'-bis(naphthalen-1-yl)-N,N'-bis(phenyl)benzidine), β-NPB (N,N'-bis(naphthalen-2-yl)-N,N'-bis(phenyl)benzidine), TPD (N,N'-bis(3-methylphenyl)-N,N'-bis(phenyl)benzidine), Spiro TPD (N,N'-bis(3-methylphenyl)-N,N'-bis(phenyl)benzidine), Spiro-NPB (N,N'-bis(naphthalen-1-yl)-N,N'-bis(phenyl)-spiro), DMFL-TPD N,N'-bis(3-methylphenyl)-N,N'-bis(phenyl)-9,9-dimethylfluorene), DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalen-1-yl)-N,N'-bis(phenyl)-9,9-diphenyl-fluorene), Spiro-TAD (2,2',7,7'-tetrakis(N,N-diphenylamino)-9,9'-spirobifluorene), 9,9-bis[4-(N,N-bisbiphenyl-4-ylamino)phenyl]-9H-fluorene, 9,9-bis[4-(N,N-bisnaphthalen-2-ylamino)phenyl]-9H-fluorene, 9,9-bis[4-(N,N'-bisnaphthalen-2-yl-N,N'-bisphenylamino)phenyl]-9H-fluorene, N,N'-bis(phenanthren-9-yl)-N,N'-bis(phenyl)benzidine, 2,7-bis[N,N-bis(9,9-spirobifluoren-2-yl)amino]-9,9-spirobifluorene, 2,2'-bis[N,N-bis(biphenyl-4-yl)amino]-9,9-spirobifluorene, 2,2'-bis(N,N-diphenylamino)-9,9-spirobifluorene, di[4-(N,N-ditolylamino)phenyl]cyclohexane, 2,2',7,7'-tetra(N,N-ditolyl)aminospirobifluorene, N,N,N',N'-tetranaphthalen-2-yl-benzidine. These units in the base structure of the organic hole transporter exhibit good hole transport properties and, moreover, can be precisely functionalized in the sense of the invention. Use may be made of the monomers, mixtures of the monomers, oligomers or polymers of an individual monomer species, or oligomers or polymers of a plurality of monomer species.

In a further embodiment, it is also possible to produce electron-blocking layers. For this purpose it may be useful for one or more electron-conducting compounds selected from the group consisting of or consisting of 2,2',2"-(1,3,5-benzinetriyl)tris(1-phenyl-1-H-benzimidazole), 2-(4-biphenylyl)-5-(4-tert-butylphenyl)-1,3,4-oxadiazole, 2,9-dimethyl-4,7-diphenyl-1,10-phenanthroline, 8-hydroxyquinolinolatolithium, 4-(naphthalen-1-yl)-3,5-diphenyl-4H-1,2,4-triazole, 1,3-bis[2-(2,2'-bipyridin-6-yl)-1,3,4-oxadiazo-5-yl]benzene, 4,7-diphenyl-1,10-phenanthroline, 3-(4-biphenylyl)-4-phenyl-5-tert-butylphenyl-1,2,4-triazole, bis(2-methyl-8-quinolinolate)-4-(phenylphenolato)aluminum, 6,6'-bis[5-(biphenyl-4-yl)-1,3,4-oxadiazo-2-yl]-2,2'-bipyridyl, 2-phenyl-9,10-di(naphthalen-2-yl)anthracene, 2,7-bis[2-(2,2'-bipyridin-6-yl)-1,3,4-oxadiazo-5-yl]-9,9-dimethylfluorene, 1,3-bis[2-(4-tert-butylphenyl)-1,3,4-oxadiazo-5-yl]benzene, 2-(naphthalen-2-yl)-4,7-diphenyl-1,10-phenanthroline, 2,9-bis(naphthalen-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f][1,10]phenanthro-line to be functionalized in accordance with the invention and reacted together with the crosslinker of the invention. In this way, stable electron blocking layers can be obtained. The method can be employed both as part of wet operations and as part of gas-phase deposition, and may in particular be used for producing high-efficiency OLEDs.

According to a further embodiment, the crosslinking reagent may comprise at least one substituent of formula 2 below

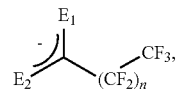

formula 2 where n=0-20. In the formula 2, moreover, each fluorine atom independently of any other may be replaced by substituted or unsubstituted heterocycles. The substituents may preferably be selected from substituted and unsubstituted heterocycles such as, for example, furan, thiophene, pyrrole, oxazole, thiazole, imidazole, isoxazole, isothazole, pyrazole, pyridine, pyrazine, pyrimidine, 1,3,6-triazine, pyrylium, alpha-pyrones, gamma-pyrones, benzofuran, benzothiophene, indole, 2H-isoindole, benzothiazole, 2-benzothiophene, 1H-benzimidazole, 1H-benzotriazole, 1,3-benzoxazole, 2-benzofuran, 7H-purine, quinoline, isoquinoline, quinazoline, quinoxaline, phthalazine, 1,2,4-benzotriazine, pyrido[2,3-d]pyrimidine, pyrido[3,2-d]pyrimidine, pteridine, acridine, phenazine, benzo[g]pteridine, 9H-carbazole, and bipyridine, and derivatives thereof. This structure of at least one ligand of the crosslinking reagent has proven particularly suitable for the method of the invention. Without being tied by the theory, the ligands modify the Lewis acidity of the metal, allowing the reaction rate and the completeness of the reaction to be controlled as a result. In one embodiment of the invention, the number of ligands according to formula 2 is limited to a maximum of 2 ligands on the metal atom.

In a further embodiment, the crosslinking of the functionalized organic matrix compound with the crosslinking reagent may also be catalyzed by the addition of oxidizing agents. For example, a functionalized organic matrix compound can be coupled by means of hydrogen peroxide to a bismuth containing crosslinker. The reaction scheme below should be understood here as merely an example:

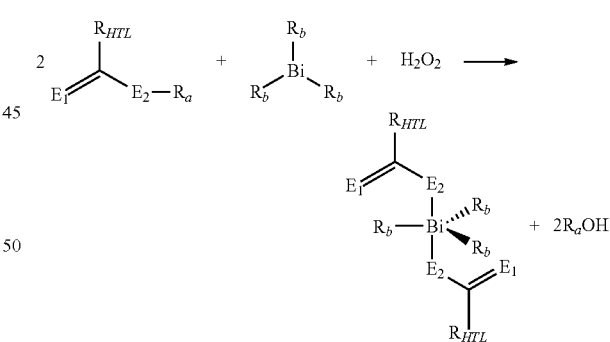

In place of the bismuth, the crosslinking reagent may of course also contain the other metals of groups 13-15. Furthermore, the organic matrix compound is illustrated without linker group L. Besides hydrogen peroxide, other oxidizing agents familiar to the skilled person are of course also contemplated. Through the addition of the oxidizing agent, it is possible in suitable cases to exert a favorable influence over the reaction rates and the degree of conversion.

In a further embodiment, the crosslinking reagent may comprise bismuth or tin and may comprise at least one substituent with the following structure below:

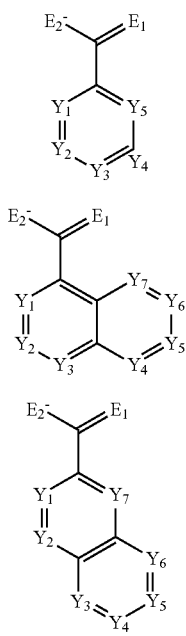

formula 3 formula 4 formula 5 where $Y_m$ with m from 1-7 independently of one another may be selected from the group consisting of C—H, C-D, C—F, C—CF$_3$, C—NO$_2$, C—CN, C—Cl, C—Br, C—CN$_3$, C—OCN, C—NCO, C—CNO, C—SCN, C—NCS, C—SeCN. These ligands on the crosslinking reagent have proven particularly suitable for reaction with the functionalized organic matrix compound. This is very likely a result of their steric configuration and of the particular capacity to control the Lewis acidity of the crosslinker by means of the selected substitution pattern. In this way, it is possible to exert influence over the reaction rate and the completeness of the reaction.

In a further embodiment, the crosslinking reagent may comprise bismuth or tin, and at least one of its substituents may be selected from the group consisting of or consisting of 2,6-difluorobenzoate, 4-fluorobenzoate, 3-fluorobenzoate, 3,5-difluorobenzoate, 3,4,5-trifluorobenzoate, 3,5-bis(trifluoromethyl)benzoate, perfluorobenzoates, 4-perfluorotoluate or mixtures thereof.

In a further embodiment, the crosslinking reagent may comprise at least one substituent selected from the following group:

fluorinated benzoates such as, for example, 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy)benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(tri-fluoromethyl)benzoate; 2,4-difluorobenzoate; 2,5-difluorobenzoate; 2,6-bis(trifluoromethyl)benzoate; 2,6-difluoro-benzoate; 2-chloro-6-fluorobenzoate; 2-fluoro-4-(trifluoro-methyl)benzoate; 2-fluoro-5-(trifluoromethyl)benzoate; 2-fluoro-6-(trifluoromethyl)benzoate; 3,4,5-trifluorobenzoate; 3,4-difluorobenzoate; 3,5-bis(trifluoromethyl) benzoate; 3-chloro-4-fluorobenzoate; 3-fluoro-5-(trifluoromethyl)benzoate; 3-fluorobenzoate; 4-fluoro-2-(trifluoromethyl)benzoate; 4-fluoro-3-(trifluoro-methyl)benzoate; 5-fluoro-2-methylbenzoate; 2-(trifluoro-methoxy)benzoate; 2,3,5-trichlorobenzoate; 4-(trifluoro-methyl)benzoate; pentafluorobenzoate; 2,3,4,5-tetra-fluorobenzoate; 2,3,5,6-tetrafluoro-4-(trifluoromethyl)-benzoate;

fluorinated or nonfluorinated phenyl acetates such as, for example, 2-fluorophenyl acetate; 3-fluorophenyl acetate; 4-fluorophenyl acetate; 2,3-difluorophenyl acetate; 2,4-difluorophenyl acetate; 2,6-difluorophenyl acetate; 3,4-difluorophenyl acetate; 3,5-difluorophenyl acetate; pentafluorophenyl acetate; 2-chloro-6-fluorophenyl acetate; 2-chloro-3,6-difluorophenyl acetate; 3-chloro-2,6-difluorophenyl acetate; 3-chloro-4-fluorophenyl acetate; 5-chloro-2-fluorophenyl acetate; 2,3,4-trifluorophenyl acetate; 2,3,5-trifluorophenyl acetate; 2,3,6-trifluorophenyl acetate; 2,4,5-trifluorophenyl acetate; 2,4,6-trifluorophenyl acetate; 3,4,5-trifluorophenyl acetate; 3-chloro-2-fluorophenyl acetate; α-fluorophenyl acetate; 4-chloro-2-fluorophenyl acetate; 2-chloro-4-fluorophenyl acetate; α,α-difluorophenyl acetate; ethyl 2,2-difluoro-2-phenyl acetate;

fluorinated or nonfluorinated acetates such as, for example, methyl trifluoroacetate; allyl trifluoroacetate; ethyl trifluoroacetate; isopropyl trifluoroacetate; 2,2,2-trifluoroethyl trifluoroacetate; difluoroacetate; trifluoroacetate; methyl chlorodifluoroacetate; ethyl bromodifluoroacetate; chlorodifluoroacetate; ethyl chlorofluoroacetate; ethyl difluoroacetate; (3-chlorophenyl) difluoroacetate; (3,5-difluorophenyl)difluoroacetate; (4-butylphenyl)difluoroacetate; (4-tert-butylphenyl) difluoroacetate; (3,4-dimethylphenyl)difluoroacetate; (3-chloro-4-fluorophenyl)difluoroacetate; (4-chlorophenyl) difluoroacetate; 2-biphenylyl-3',5'-difluoroacetate; 3-biphenylyl-3',5'-difluoroacetate; 4-biphenylyl-3',5'-difluoroacetate; 2-biphenylyl-3',4'-difluoro-acetate; 3-biphenylyl-3',4'-difluoroacetate; 4-biphenylyl-3',4'-difluoroacetate, and 2,2-difluoropropionate.

These ligands on the crosslinking reagent have proven particularly suitable for rapid reaction. With short operating times it is possible to obtain highly efficient hole-transporting layers. It is also possible to use the higher homologs of these compounds. It is possible advantageously also to select every ligand of the crosslinker from compounds indicated above. It may also be advantageous, moreover, for every ligand in the crosslinking reagent to correspond to only one of the compounds specified above.

Within one embodiment of the method, the crosslinking reagent may be a substituted or nonsubstituted triarylbismuth complex. The symmetric selection of the ligands of the crosslinking reagent, comprising bismuth, with arylene, in particular, has proven particularly suitable in the context of the method of the invention. Without being tied by theory, this might in particular result from the fact that the aryls can be eliminated particularly easily by the functionalized organic matrix compound. A further advantageous consequence is that the leaving group obtained is benzene, toluene or xylene, which is frequently used as solvent in wet operations, moreover.

In one additional embodiment, the functionalized organic matrix compound may comprise a further fraction of greater than or equal to 0 weight % and less than or equal to 50 weight % of nonfunctionalized matrix compound. In the context of the configuration of the method in accordance with the invention, it may be expedient not to functionalize the entire amount of organic matrix compound and/or to mix in nonfunctionalized matrix compounds. By means of this fraction of nonfunctionalized organic matrix compound it is possible, for example, to influence certain properties of the p-conducting layer, such as the growth behavior or crystallization behavior, for example. It is possible with preference to add greater than or equal to 0 weight % and less than or equal to 20 weight %, and more preferably greater than or equal to 0 weight % and less than or equal to 10 weight %, of nonfunctionalized organic matrix compound.

In one embodiment of the method, the crosslinking reagent and the organic matrix compound may be reacted on the substrate by means of a temperature treatment in a range of greater than or equal to 50° C. and less than or equal to 300° C. For the reliable and complete reaction of the crosslinking reagent with the functionalized organic matrix compound it may be advantageous to bring about a more rapid and complete reaction by means of a temperature treatment in the temperature range indicated above. This may also have advantageous consequences for the operating economics. Furthermore, this temperature treatment may be utilized to remove the solvent as part of a wet operation. In this way, with a low energy consumption, the solvent is removed and the crosslinking is implemented rapidly.

Other embodiments provide an organoelectric component comprising at least one hole-transporting electrical layer produced by the method of the invention. In organoelectric components in particular, the hole-transporting layers of the invention can be used to particularly advantageous effect. Firstly, the operation regime presented permits an extremely high-efficiency and cost-effective production, and, secondly, the strong attachment of the dopant to the organic matrix produces particularly long-lived and solvent-resistant p-conductive layers. This may contribute to a high degree to the fail safety and effective capacity for further processing of the components obtainable accordingly.

In particular, the layers produced by the method of the invention can be used in components such as organic solar cells, organic transistors, light-emitting organic components, organic light-emitting diodes and/or organically light-emitting electrochemical cells. The method described and the functionalized layers which can be produced accordingly may find use, correspondingly, for absorbing components such as photodiodes or solar cells. The method of the invention is also suitable in particular for the production of bipolar transistors. The method is compatible with the standard production steps of these components, and in this way it is possible for long-lived and efficient components to be obtained inexpensively.

With regard to further advantages and features of the organic semiconductor components described above, reference is hereby made exclusively to the explanations in connection with the method of the invention and with the use in accordance with the invention. Inventive features and advantages of the method of the invention are also intended to be applicable, and deemed disclosed, for the components of the invention and the use in accordance with the invention as well, and vice versa. The invention also embraces all combinations of at least two of features disclosed in the description and/or in the claims, unless explicitly excluded.

The above-described properties, features, and advantages of this invention, and also the manner in which they are achieved, will become clearer and more clearly comprehensible in connection with the description below of the exemplary embodiments, elucidated in more detail in connection with the drawings.

Figure 2:
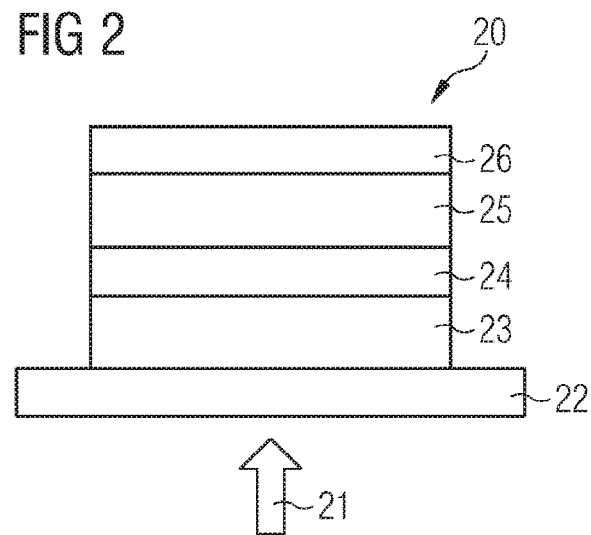
FIG. 2 shows schematically the construction of an organic solar cell with a PIN structure that converts light into electrical current, according to an example embodiment.
Figure 3:
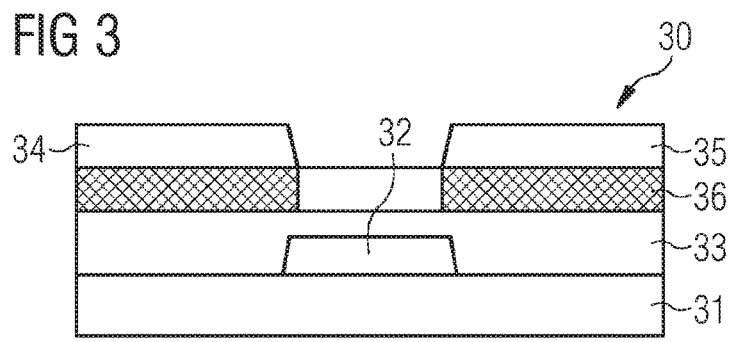
FIG. 3 shows schematically an example cross section of an organic field-effect transistor, according to an example embodiment.

The layer construction of components for organic electronics is elucidated in more detail below with reference to figures. In the figures FIG. 1 shows schematically the construction of an organic light-emitting diode (10). The light-emitting diode is constructed of a glass layer (1); silicone or indium tin oxide (ITO) layer (2); hole injector layer (3); hole transport layer (HTL) (4); emitter layer (EML) (5); hole blocker layer (HBL) (6); electron transport layer (ETL) (7); electron injector layer (8); and a cathode layer (9);

FIG. 2 shows schematically the construction of an organic solar cell with PIN structure (20), which converts light (21) into electrical current. The solar cell consists of a layer of indium tin oxide (22); a p-doped layer (23); an absorption layer (24); an n-doped layer (25); and a metal layer (26);

FIG. 3 shows schematically one possible cross section of an organic field-effect transistor (30). Applied on a substrate (31) are a gate electrode (32), a gate dielectric (33), a source and drain contact (34+35), and an organic semiconductor (36). The shaded areas show the areas at which contact doping is useful.

EXAMPLES

The deposition and crosslinking of the layer may take place sequentially or within the same workstep. It is also possible to combine reduced-pressure operations and wet operations. Identified below are a number of embodiments, which in principle can be combined and/or extended:

a. Carboxylic acid-functionalized hole transporters (oligomeric or of low molecular mass) are applied by reduced-pressure vapor deposition together with a Bi-containing crosslinker. The layer is subsequently heated at 80-300° C. Complete crosslinking is obtained.

b. Carboxylic acid-functionalized hole transporters (oligomeric or of low molecular mass) are applied by reduced-pressure vapor deposition alone. The layer is subsequently exposed to the vapor or a solution of the crosslinker, for the crosslinking then to be performed with initiation by temperature or light.

c. Carboxylic acid-functionalized hole transporters (oligomeric or of low molecular mass) are deposited from solution together with the crosslinker reagent. The layer is subsequently heated at 80-300° C.

d. Carboxylic acid-functionalized hole transporters (oligomeric or of low molecular mass) are deposited from solution alone. The layer is subsequently exposed to the vapor or a solution of the crosslinker, for the crosslinking then to be performed with initiation by temperature or light.

Although the invention has been described and illustrated in more detail by the preferred exemplary embodiment, the invention is not restricted by the examples disclosed, and other variations may be derived therefrom by the skilled person without leaving the scope of protection of the invention.

What is claimed is:

1. A method for producing hole-transporting electrical layers, the method comprising:
   providing a substrate;
   providing at least one crosslinking reagent; and
   reacting a functionalized organic matrix compound with the at least one crosslinking reagent on the substrate to form compounds of relatively high molecular mass,
   wherein the functionalized organic matrix compound conforms to formula 1:

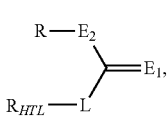

formula 1 where:
- L is a bond or is selected from the group consisting of substituted or nonsubstituted, saturated or unsaturated C1-C50 alkyl, aryl, polyethylene glycol, polyethylenediamine, polyester, polyurethane, polyvinylidenephenyl chains, and mixtures thereof;
- $E_1$, $E_2$ independently of one another may be oxygen, sulfur, selenium, NH or $NE_3$,
- optionally $E_3$, wherein $E_3$ is selected from the group consisting of substituted or nonsubstituted alkyl and aryl, and $E_3$ is bound to R as follows:

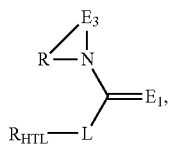

- R is selected from the group consisting of H, D, C1-C10 alkyl-silyl or aryl-silyl esters, fluorinated or nonfluorinated branched or unbranched C1-C10 alkyl, aryl, and heteroaryl,
- $R_{HTL}$ is selected from the group consisting of PEDOT (poly(3,4-ethylenedioxythiophene)), PVK (poly(9-vinylcarbazole)), PTPD (poly(N,N'-bis(4-butylphenyl)-N,N'-bis(phenyl)benzidine)), PANI (polyaniline), P3HT (poly(3-hexylthiophene)), and mixtures thereof, and
- the crosslinking reagent comprises at least one metal atom from groups 13-15 and at least one organic ligand.

2. The method of claim 1, wherein $E_1$ and $E_2$ are oxygen.

3. The method of claim 1, wherein the crosslinking reagent comprises metal atoms from the group consisting of bismuth, tin, lead, and mixtures thereof.

4. The method of claim 1, where the crosslinking reagent comprises bismuth or tin and at least one ligand of the crosslinking reagent is selected from the group consisting of substituted or nonsubstituted C1-C200 aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, and haloketoalkenyl, and, in the case of appropriate radicals, one or more nonadjacent $CH_2$ groups independently of one another may be replaced by —O—, —S—, —NH—, —SiR°R°°—, —CO—, —COO—, —OCO—, —OCO—O—, —$SO_2$—, —S—CO—, —CO—S—, —C=C— or —C≡C—, such that O and/or S atoms are not joined directly to one another.

5. The method of claim 1, wherein the crosslinking reagent comprises at least one substituent according to formula 2:

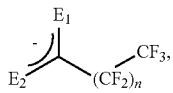

formula 2 where n=0-20.

6. The method of claim 1, wherein the crosslinking reagent comprises bismuth or tin and comprises at least one substituent with the following structure:

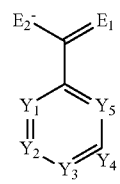

formula 3

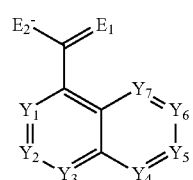

formula 4

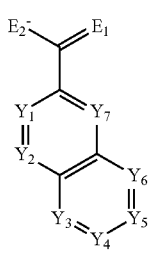

formula 5 wherein each of $Y_1$ through $Y_7$ is independently selected from the group consisting of C—H, C-D, C—F, C—$CF_3$, C—$NO_2$, C—CN, C—Cl, C—Br, C—$CN_3$, C—OCN, C—NCO, C—CNO, C—SCN, C—NCS, and C—SeCN.

7. The method of claim 1, wherein the crosslinking reagent comprises at least one substituent selected from the group of 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy)benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(trifluoromethyl)benzoate; 2,4-difluorobenzoate; 2,5-difluorobenzoate; 2,6-bis(trifluoromethyl)benzoate; 2,6-difluorobenzoate; 2-chloro-6-fluorobenzoate; 2-fluoro-4-(trifluoromethyl)benzoate; 2-fluoro-5-(trifluoromethyl)benzoate; 2-fluoro-6-(trifluoromethyl)-benzoate; 3,4,5-trifluorobenzoate; 3,4-difluorobenzoate; 3,5-bis(trifluoromethyl)benzoate; 3-(trifluoromethyl)benzoate; 3-chloro-4-fluorobenzoate; 3-fluoro-5-(trifluoromethyl)benzoate; 3-fluorobenzoate; 4-fluoro-2-(trifluoromethyl)benzoate; 4-fluoro-3-(trifluoromethyl)benzoate; 5-fluoro-2-methylbenzoate; 2-(trifluoromethoxy)benzoate; 2,3,5-trichlorobenzoate; 4-(trifluoromethyl)benzoate; pentafluorobenzoate; 2,3,4,5-tetrafluorobenzoate; 2,3,5,6-tetrafluoro-4-(trifluoromethyl)benzoate; 2-fluorophenyl acetate; 3-fluorophenyl acetate;

4-fluorophenyl acetate; 2,3-difluorophenyl acetate; 2,4-difluorophenyl acetate; 2,6-difluorophenyl acetate; 3,4-difluorophenyl acetate; 3,5-difluorophenyl acetate; pentafluorophenyl acetate; 2-chloro-6-fluorophenyl acetate; 2-chloro-3,6-difluorophenyl acetate; 3-chloro-2,6-difluorophenyl acetate; 3-chloro-4-fluorophenyl acetate; 5-chloro-2-fluorophenyl acetate; 2,3,4-trifluorophenyl acetate; 2,3,5-trifluorophenyl acetate; 2,3,6-trifluorophenyl acetate; 2,4,5-trifluorophenyl acetate; 2,4,6-trifluorophenyl acetate; 3,4,5-trifluorophenyl acetate; 3-chloro-2-fluorophenyl acetate; α-fluorophenyl acetate; 4-chloro-2-fluorophenyl acetate; 2-chloro-4-fluorophenyl acetate; α,α-difluorophenyl acetate; ethyl 2,2-difluoro-2-phenyl acetate; methyl trifluoroacetate; allyl trifluoroacetate; ethyl trifluoroacetate; isopropyl trifluoroacetate; 2,2,2-trifluoroethyl trifluoroacetate; difluoroacetate; trifluoroacetate; methyl chlorodifluoroacetate; ethyl bromo-difluoroacetate; chlorodifluoroacetate; ethyl chlorofluoroacetate; ethyl difluoroacetate; (3-chlorophenyl)difluoroacetate; (3,5-difluorophenyl)difluoroacetate; (4-dimethylphenyl)difluoroacetate; (3-chloro-4-fluorophenyl)difluoroacetate; (4-chlorophenyl)difluoroacetate; 2-biphenylyl-3',5'-difluoroacetate; 3-biphenylyl-3',5'-difluoroacetate; 4-biphenylyl-3',5'-difluoroacetate; 2-biphenylyl-3',4'-difluoroacetate; 3-biphenylyl-3',4'-difluoroacetate; 4-biphenylyl-3',4'-difluoroacetate, and 2,2-difluoropropionate.

8. The method of claim 1, wherein the crosslinking reagent comprises bismuth or tin and includes at least one substituent selected from the group consisting of 2,6-difluorobenzoate, 4-fluorobenzoate, 3-fluorobenzoate, 3,5-difluorobenzoate, 3,4,5-trifluorobenzoate, 3,5-bis(trifluoromethyl)benzoate, perfluorobenzoate, 4-perfluorotoluate, and mixtures thereof.

9. The method of claim 1, wherein the crosslinking reagent is a substituted or nonsubstituted triaryl-bismuth complex.

10. The method of claim 1, wherein the crosslinking reagent and the organic matrix compound are reacted on the substrate using a temperature treatment in a range of greater than or equal to 50° C. and less than or equal to 300° C.

11. The method of claim 1, wherein the functionalized organic matrix compound comprises a further fraction of greater than or equal to 0 weight % and less than or equal to 50 weight % of nonfunctionalized matrix compound.

12. A method for producing hole-transporting electrical layers, the method comprising:
providing a substrate;
providing at least one crosslinking reagent; and
reacting a functionalized organic matrix compound with the at least one crosslinking reagent on the substrate to form compounds of relatively high molecular mass,
wherein the functionalized organic matrix compound conforms to formula 1:

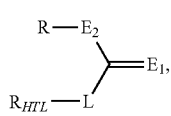

formula 1 where:
L is a bond or is selected from the group consisting of substituted or nonsubstituted, saturated or unsaturated C1-C50 alkyl, aryl, polyethylene glycol, polyethylenediamine, polyester, polyurethane, polyvinylidenephenyl chains, and mixtures thereof;

$E_1$, $E_2$ independently of one another may be oxygen, sulfur, selenium, NH or $NE_3$, optionally $E_3$, wherein $E_3$ is selected from the group consisting of substituted or nonsubstituted alkyl and aryl, and $E_3$ is bound to R as follows:

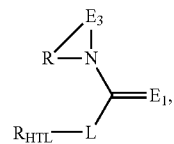

R is selected from the group consisting of H, D, C1-C10 alkyl-silyl or aryl-silyl esters, fluorinated or nonfluorinated branched or unbranched C1-C10 alkyl, aryl, and heteroaryl, $R_{HTL}$ is selected from the group consisting of C20-C200 triarylamine-based hole transporters, thiophene-containing derivatives thereof, and mixtures thereof, and the crosslinking reagent comprises at least one metal atom from groups 13-15 and at least one organic ligand.

13. The method of claim 12, wherein $E_1$ and $E_2$ are oxygen.

14. The method of claim 12, wherein the crosslinking reagent comprises metal atoms from the group consisting of bismuth, tin, lead, and mixtures thereof.

15. The method of claim 12, where the crosslinking reagent comprises bismuth or tin and at least one ligand of the crosslinking reagent is selected from the group consisting of substituted or nonsubstituted C1-C200 aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, and haloketoalkenyl, and, in the case of appropriate radicals, one or more nonadjacent $CH_2$ groups independently of one another may be replaced by —O—, —S—, —NH—, —NR°—, —SiR°R°°—, —CO—, —COO—, —OCO—, —OCO—O—, —SO$_2$—, —S—CO—, —CO—S—, —C=C— or —C≡C—, such that O and/or S atoms are not joined directly to one another.

16. The method of claim 12, wherein the crosslinking reagent comprises at least one substituent according to formula 2:

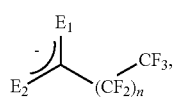

formula 2 where n=0-20.

17. The method of claim 12, wherein the crosslinking reagent comprises bismuth or tin and comprises at least one substituent with the following structure:

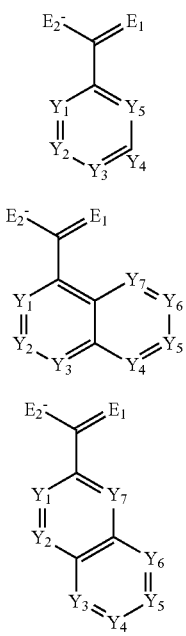

formula 3 formula 4 formula 5 wherein each of $Y_1$ through $Y_7$ is independently selected from the group consisting of C—H, C-D, C—F, C—CF$_3$, C—NO$_2$, C—CN, C—Cl, C—Br, C—CN$_3$, C—OCN, C—NCO, C—CNO, C—SCN, C—NCS, and C—SeCN.

18. The method of claim 12, wherein the crosslinking reagent comprises at least one substituent selected from the group of 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy) benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(trifluoromethyl) benzoate; 2,4-difluorobenzoate; 2,5-difluorobenzoate; 2,6-bis(trifluoromethyl)benzoate; 2,6-difluorobenzoate; 2-chloro-6-fluorobenzoate; 2-fluoro-4-(trifluoromethyl)benzoate; 2-fluoro-5-(trifluoromethyl)benzoate; 2-fluoro-6-(trifluoromethyl)benzoate; 3,4,5-trifluorobenzoate; 3,4-difluorobenzoate; 3,5-bis(trifluoromethyl)benzoate; 3-(trifluoromethyl)benzoate; 3-chloro-4-fluorobenzoate; 3-fluoro-5-(trifluoromethyl)benzoate; 3-fluorobenzoate; 4-fluoro-2-(trifluoromethyl)benzoate; 4-fluoro-3-(trifluoromethyl)benzoate; 5-fluoro-2-methylbenzoate; 2-(trifluoromethoxy)benzoate; 2,3,5-trichlorobenzoate; 4-(trifluoromethyl)benzoate; pentafluorobenzoate; 2,3,4,5-tetrafluorobenzoate; 2,3,5,6-tetrafluoro-4-(trifluoromethyl) benzoate; 2-fluorophenyl acetate; 3-fluorophenyl acetate; 4-fluorophenyl acetate; 2,3-difluorophenyl acetate; 2,4-difluorophenyl acetate; 2,6-difluorophenyl acetate; 3,4-difluorophenyl acetate; 3,5-difluorophenyl acetate; pentafluorophenyl acetate; 2-chloro-6-fluorophenyl acetate; 2-chloro-3,6-difluorophenyl acetate; 3-chloro-2,6-difluorophenyl acetate; 3-chloro-4-fluorophenyl acetate; 5-chloro-2-fluorophenyl acetate; 2,3,4-trifluorophenyl acetate; 2,3,5-trifluorophenyl acetate; 2,3,6-trifluorophenyl acetate; 2,4,5-trifluorophenyl acetate; 2,4,6-trifluorophenyl acetate; 3,4,5-trifluorophenyl acetate; 3-chloro-2-fluorophenyl acetate; α-fluorophenyl acetate; 4-chloro-2-fluorophenyl acetate; 2-chloro-4-fluorophenyl acetate; α,α-difluorophenyl acetate; ethyl 2,2-difluoro-2-phenyl acetate; methyl trifluoroacetate; allyl trifluoroacetate; ethyl trifluoroacetate; isopropyl trifluoroacetate; 2,2,2-trifluoroethyl trifluoroacetate; difluoroacetate; trifluoroacetate; methyl chlorodifluoroacetate; ethyl bromo-difluoroacetate; chlorodifluoroacetate; ethyl chlorofluoroacetate; ethyl difluoroacetate; (3-chlorophenyl)difluoroacetate; (3,5-difluorophenyl)difluoroacetate; (4-butylphenyl)difluoroacetate; (4-tert-butylphenyl)difluoroacetate; (3,4-dimethylphenyl)difluoroacetate; (3-chloro-4-fluorophenyl)difluoroacetate; (4-chlorophenyl)difluoroacetate; 2-biphenylyl-3',5'-difluoroacetate; 3-biphenylyl-3',5'-difluoroacetate; 4-biphenylyl-3',5'-difluoroacetate; 2-biphenylyl-3',4'-difluoroacetate; 3-biphenylyl-3',4'-difluoroacetate; 4-biphenylyl-3',4'-difluoroacetate, and 2,2-difluoropropionate.

19. The method of claim 12, wherein the crosslinking reagent comprises bismuth or tin and includes at least one substituent selected from the group consisting of 2,6-difluorobenzoate, 4-fluorobenzoate, 3-fluorobenzoate, 3,5-difluorobenzoate, 3,4,5-trifluoro-benzoate, 3,5-bis(trifluoromethyl)benzoate, perfluorobenzoate, 4-perfluorotoluate, and mixtures thereof.

20. A method for producing hole-transporting electrical layers, the method comprising:
providing a substrate;
providing at least one crosslinking reagent; and
reacting a functionalized organic matrix compound with the at least one crosslinking reagent on the substrate to form compounds of relatively high molecular mass, wherein the functionalized organic matrix compound conforms to formula 1:

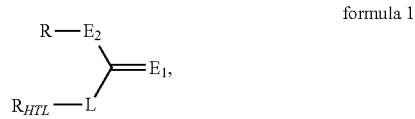

formula 1 where:
L is a bond or is selected from the group consisting of substituted or nonsubstituted, saturated or unsaturated C1-C50 alkyl, aryl, polyethylene glycol, polyethylenediamine, polyester, polyurethane, polyvinylidenephenyl chains, and mixtures thereof;
$E_1$, $E_2$ independently of one another may be oxygen, sulfur, selenium, NH or NE$_3$,
optionally $E_3$, wherein $E_3$ is selected from the group consisting of substituted or nonsubstituted alkyl and aryl, and $E_3$ is bound to R as follows:

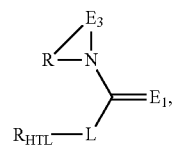

R is selected from the group consisting of H, D, C1-C10 alkyl-silyl or aryl-silyl esters, fluorinated or nonfluorinated branched or unbranched C1-C10 alkyl, aryl, and heteroaryl,
$R_{HTL}$ is a substituted compound functionalized with at least one compound selected from the group consisting of NPB (N,N'-bis(naphthalen-1-yl)-N,N'-bis(phenyl)benzidine),
β-NPB (N,N'-bis(naphthalen-2-yl)-N,N'-bis(phenyl)benzidine),
TPD (N,N'-bis(3-methylphenyl)-N,N'-bis(phenyl)benzidine),
Spiro TPD (N,N'-bis(3-methylphenyl)-N,N'-bis(phenyl)benzidine),
Spiro-NPB (N,N'-bis(naphthalen-1-yl)-N,N'-bis(phenyl)-spiro),
DMFL-TPD (N,N'-bis(3-methylphenyl)-N,N'-bis(phenyl)-9,9-dimethylfluorene),
DMFL-NPB (N,N'-bis(naphthalen-1-yl)-N,N'-bis(phenyl)-9,9-dimethylfluorene),
DPFL-TPD (N,N'-bis(3-methylphenyl)-N,N'-bis(phenyl)-9,9-diphenylfluorene),
DPFL-NPB (N,N'-bis(naphthalen-1-yl)-N,N'-bis(phenyl)-9,9-diphenylfluorene),
Spiro-TAD (2,2',7,7'-tetrakis(N,N-diphenylamino)-9,9'-spirobifluorene),
9,9-bis[4-(N,N-bisbiphenyl-4-ylamino)phenyl]-9H-fluorene,
9,9-bis[4-(N,N-bisnaphthalen-2-ylamino)phenyl]-9H-fluorene,
9,9-bis[4-(N,N'-bisnaphthalen-2-yl-N,N'-bisphenylamino)phenyl]-9H-fluorene,
N,N'-bis(phenanthren-9-yl)-N,N'-bis(phenyl)benzidine,
2,7-bis[N,N-bis(9,9-spirobifluoren-2-yl)amino]-9,9-spirobifluorene,
2,2'-bis[N,N-bis(biphenyl-4-yl)amino]-9,9-spirobifluorene,
2,2'-bis(N,N-diphenylamino)-9,9-spirobifluorene,
di[4-(N,N-ditolylamino)phenyl]cyclohexane,
2,2',7,7'-tetra(N,N-ditolyl)aminospirobifluorene,
N,N,N',N'-tetranaphthalen-2-ylbenzidine and mixtures thereof, and
 the crosslinking reagent comprises at least one metal atom from groups 13-15 and at least one organic ligand;
 wherein the crosslinking reagent and the organic matrix compound are reacted on the substrate using a temperature treatment in a range of greater than or equal to 50° C. and less than or equal to 300° C.

21. The method of claim 20, wherein $E_1$ and $E_2$ are oxygen.

22. The method of claim 20, wherein the crosslinking reagent comprises metal atoms from the group consisting of bismuth, tin, lead, and mixtures thereof.

23. The method of claim 20, where the crosslinking reagent comprises bismuth or tin and at least one ligand of the crosslinking reagent is selected from the group consisting of substituted or nonsubstituted C1-C200 aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, and haloketoalkenyl, and, in the case of appropriate radicals, one or more nonadjacent $CH_2$ groups independently of one another may be replaced by —O—, —S—, —NH—, —NR°—, —SiR°R°°—, —CO—, —COO—, —OCO—, —OCO—O—, —SO₂—, —S—CO—, —CO—S—, —C=C— or —C≡C—, such that O and/or S atoms are not joined directly to one another.

24. The method of claim 20, wherein the crosslinking reagent comprises at least one substituent according to formula 2:

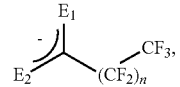

formula 2 where n=0-20.

25. The method of claim 20, wherein the crosslinking reagent comprises bismuth or tin and comprises at least one substituent with the following structure:

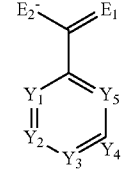

formula 3

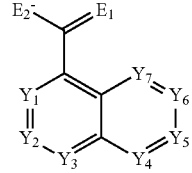

formula 4

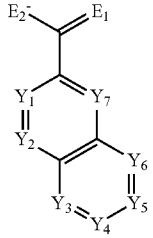

formula 5 wherein each of $Y_1$ through $Y_7$ is independently selected from the group consisting of C—H, C-D, C—F, C—CF₃, C—NO₂, C—CN, C—Cl, C—Br, C—CN₃, C—OCN, C—NCO, C—CNO, C—SCN, C—NCS, and C—SeCN.

26. The method of claim 20, wherein the crosslinking reagent comprises at least one substituent selected from the group of 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy)benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(trifluoromethyl)benzoate; 2,4-difluorobenzoate; 2,5-difluorobenzoate; 2,6-bis(trifluoromethyl)benzoate; 2,6-difluorobenzoate; 2-chloro-6-fluorobenzoate; 2-fluoro-4-(trifluoromethyl)benzoate; 2-fluoro-5-(trifluoromethyl)benzoate; 2-fluoro-6-(trifluoromethyl)benzoate; 3,4,5-trifluorobenzoate; 3,4-difluorobenzoate; 3,5-bis(trifluoromethyl)benzoate; 3-(trifluoromethyl)benzoate; 3-chloro-4-fluorobenzoate; 3-fluoro-5-(trifluoromethyl)benzoate; 3-fluorobenzoate; 4-fluoro-2-(trifluoromethyl)benzoate; 4-fluoro-3-(trifluoromethyl)benzoate; 5-fluoro-2-methylbenzoate; 2-(trifluoromethoxy)benzoate; 2,3,5-trichlorobenzoate; 4-(trifluoromethyl)benzoate; pentafluorobenzoate; 2,3,4,5-tetrafluorobenzoate; 2,3,5,6-tetrafluoro-4-(trifluoromethyl)benzoate; 2-fluorophenyl acetate; 3-fluorophenyl acetate;

4-fluorophenyl acetate; 2,3-difluorophenyl acetate; 2,4-difluorophenyl acetate; 2,6-difluorophenyl acetate; 3,4-difluorophenyl acetate; 3,5-difluorophenyl acetate; pentafluorophenyl acetate; 2-chloro-6-fluorophenyl acetate; 2-chloro-3,6-difluorophenyl acetate; 3-chloro-2,6-difluorophenyl acetate; 3-chloro-4-fluorophenyl acetate; 5-chloro-2-fluorophenyl acetate; 2,3,4-trifluorophenyl acetate; 2,3,5-trifluorophenyl acetate; 2,3,6-trifluorophenyl acetate; 2,4,5-trifluorophenyl acetate; 2,4,6-trifluorophenyl acetate; 3,4,5-trifluorophenyl acetate; 3-chloro-2-fluorophenyl acetate; α-fluorophenyl acetate; 4-chloro-2-fluorophenyl acetate; 2-chloro-4-fluorophenyl acetate; α,α-difluorophenyl acetate; ethyl 2,2-difluoro-2-phenyl acetate; methyl trifluoroacetate; allyl trifluoroacetate; ethyl trifluoroacetate; isopropyl trifluoroacetate; 2,2,2-trifluoroethyl trifluoroacetate; difluoroacetate; trifluoroacetate; methyl chlorodifluoroacetate; ethyl bromo-difluoroacetate; chlorodifluoroacetate; ethyl chlorofluoroacetate; ethyl difluoroacetate; (3-chlorophenyl)difluoroacetate; (3,5-difluorophenyl)difluoroacetate; (4-butylphenyl)difluoroacetate; (4-tert-butylphenyl)difluoroacetate; (3,4-dimethylphenyl)difluoroacetate; (3-chloro-4-fluorophenyl)difluoroacetate; (4-chlorophenyl)difluoroacetate; 2-biphenylyl-3',5'-difluoroacetate; 3-biphenylyl-3',5'-difluoroacetate; 4-biphenylyl-3',5'-difluoroacetate; 2-biphenylyl-3',4'-difluoroacetate; 3-biphenylyl-3',4'-difluoroacetate; 4-biphenylyl-3',4'-difluoroacetate, and 2,2-difluoropropionate.

27. The method of claim 20, wherein the crosslinking reagent comprises bismuth or tin and includes at least one substituent selected from the group consisting of 2,6-difluorobenzoate, 4-fluorobenzoate, 3-fluorobenzoate, 3,5-difluorobenzoate, 3,4,5-trifluoro-benzoate, 3,5-bis(trifluoromethyl)benzoate, perfluorobenzoate, 4-perfluorotoluate, and mixtures thereof.

* * * * *